(12) United States Patent
Hansquine

(10) Patent No.: US 6,757,864 B1
(45) Date of Patent: Jun. 29, 2004

(54) METHOD AND APPARATUS FOR EFFICIENTLY READING AND STORING STATE METRICS IN MEMORY FOR HIGH-SPEED ACS VITERBI DECODER IMPLEMENTATIONS

(75) Inventor: David W. Hansquine, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 09/544,324

(22) Filed: Apr. 6, 2000

(51) Int. Cl.[7] .......................... H03M 13/00; H03D 1/00
(52) U.S. Cl. ...................................... 714/794; 375/341
(58) Field of Search ........................... 714/794; 375/341

(56) References Cited

U.S. PATENT DOCUMENTS

| | | | |
|---|---|---|---|
| 4,583,078 A | * 4/1986 | Shenoy et al. ................. | 341/51 |
| 4,905,317 A | * 2/1990 | Suzuki et al. .................. | 341/51 |
| 4,979,175 A | * 12/1990 | Porter ........................... | 714/795 |
| 5,220,570 A | * 6/1993 | Lou et al. ...................... | 714/791 |
| 5,416,787 A | 5/1995 | Kodama et al. | |
| 5,502,735 A | * 3/1996 | Cooper ......................... | 714/794 |
| 5,742,621 A | * 4/1998 | Amon et al. .................. | 714/792 |
| 5,881,075 A | * 3/1999 | Kong et al. ................... | 714/795 |
| 5,923,713 A | 7/1999 | Hatakeyama | |
| 6,269,130 B1 | * 7/2001 | Hansquine .................... | 375/341 |
| 6,317,472 B1 | * 11/2001 | Choi et al. .................... | 375/341 |
| 6,351,839 B1 | * 2/2002 | Lee et al. ...................... | 714/795 |
| 6,504,882 B1 | * 1/2003 | Kim ............................. | 375/341 |

FOREIGN PATENT DOCUMENTS

| | | | |
|---|---|---|---|
| EP | 0720303 | 12/1995 | |
| EP | 1130788 | 3/2001 | |
| GB | 0788241 | * 4/1996 | .......... H03M/13/00 |
| WO | 0008768 | 2/2000 | |
| WO | 0103308 | 1/2001 | |

OTHER PUBLICATIONS

Rader, Charles, *Memory Management in a Viterbi Decoder:* IEEE Transactions on Communications, vol. Com–29, No. 9:1399–1401 (1981).

* cited by examiner

*Primary Examiner*—Albert Decady
*Assistant Examiner*—Esaw Abraham
(74) *Attorney, Agent, or Firm*—Philip R. Wadsworth; Charles D. Brown; Kevin T. Cheatham

(57) ABSTRACT

The present invention discloses a method and apparatus for efficiently reading and storing state metrics in memory to enhance high-speed ACS Viterbi decoder implementations. The method includes applying an addressing scheme that determines the address locations of source state metrics during a process cycle. The source state metrics are then read from the address locations during the process cycle and applied to an add-compare-select butterfly operation of a Viterbi algorithm implementation to generate target state metrics. The method then stores each of the target state metrics into the address locations previously occupied by the source state metrics. The method further provides an addressing scheme that determines the address locations of the source state metrics based on a process cycle counter that is incremented and rotated in accordance with the process cycle. The method also provides an addressing scheme that employs a predetermined function to determine the address locations of the source state metrics.

18 Claims, 12 Drawing Sheets

| $c_4$ | $c_3$ | $c_2$ | $c_1$ | $c_0$ | $d_2$ | $d_1$ | $d_0$ |

| $c_0$ |

| $b_3$ | $b_2$ | $b_1$ | $b_0$ | $d_2$ | $d_1$ | $d_0$ |

FIG. 10A

| $c_5$ | $c_4$ | $c_3$ | $c_2$ | $c_1$ | $c_0$ | $d_1$ | $d_0$ |

FIG. 10B

| $c_0$ |

| $b_4$ | $b_3$ | $b_2$ | $b_1$ | $b_0$ | $d_1$ | $d_0$ |

METHOD AND APPARATUS FOR EFFICIENTLY READING AND STORING STATE METRICS IN MEMORY FOR HIGH-SPEED ACS VITERBI DECODER IMPLEMENTATIONS

BACKGROUND OF THE INVENTION

1. Field of the Invention

This invention generally relates to applications of the Viterbi algorithm. More particularly, the present invention relates to a novel method and apparatus for storing and retrieving state metrics in order to enhance the performance of high-rate Add-Compare-Select (ACS) butterfly operations in Viterbi implementations.

2. Description of Related Art

The Viterbi algorithm was first introduced in 1967 as a method for decoding convolutionally encoded signals. Since its introduction, the algorithm has gained wide acceptance in the fields of data communications, data recording, and digital signal processing. The algorithm has been used successfully in a variety of digital estimation applications, including the reduction of recording errors in storage media, the removal of intersymbol interference, and the enhancement of character and text recognition.

As such, the Viterbi algorithm has become the foremost method for the error-correction decoding of convolutionally encoded data. For such applications, the Viterbi algorithm determines, based on a series of observations, the path with the smallest error metric that traverses a trellis typifying all possible encoder states. The sequence of states along this "shortest path" corresponds to the sequence mostly likely generated by the convolutional encoder.

FIG. 1A illustrates a typical convolutional encoder. This convolutional encoder 100 comprises an 8-bit tapped shift register 110 and a pair of exclusive OR-type summers 120 that transform a sequence of bits from an input bit stream U(D) 105 into a paired sequence 125 of output code symbols $C_0(D)$, $C_1(D)$. In particular, FIG. 1A demonstrates the example of a rate ½ code which generates a set of two output coding symbols $C_0(D)$, $C_1(D)$ 125 for each bit inputted from input bit stream U(D) 105. It is to be noted that the specific code rate and configuration of the convolutional encoder 100 shown are merely illustrative and in no way limit the operation or scope of the various embodiments of the invention. As such, different code rates, such as ⅓ or ¾, for example, may be used in conjunction with embodiments of the invention as described below.

Encoder 100 generates each output code symbol pair $C_0(D)$, $C_1(D)$ of sequence 125 by shifting and exclusive-OR summing the input bit stream U(D) 105 according to the particular shift-register configuration specified by generator code polynomials $G_0(D)$, $G_1(D)$. In this case, FIG. 1A depicts a configuration corresponding to the rate ½ generator code polynomial $G_0(D)=1 \oplus D^2 \oplus D^4 \oplus D^7$. The coefficients of polynomial $G_0(D)$ are convolved with input bit stream U(D) 105 to generate output convolutional code symbol $C_0(D)$ of sequence 125. Similarly, FIG. 1A also shows a configuration that corresponds to the rate ½ generator code polynomial $G_1(D)=1 \oplus D^2 \oplus D^5$, whose coefficients are convolved with input bit stream U(D) 105 to generate output convolutional code symbol $C_1(D)$ of sequence 125.

The constraint length K of encoder 100 is one more than the number of delay elements in shift register 110. For encoder 100, for example, constraint length K equals 9. For each data bit of input bit stream U(D) 105 inputted into encoder 100, the output code symbol pair $C_0(D)$, $C_1(D)$ of sequence 125 may depend on the inputted bit as well as the previous K−1 input bits. Therefore, encoder 100 produces output code symbol pairs that are capable of spanning $2^{K-1}$ possible encoder states.

In a typical communication system, the output code symbol pairs $C_0(D)$, $C_1(D)$ of sequence 125 are subsequently modulated and transmitted over a noisy channel (not shown). A decoder eventually receives the noisy convolutionally encoded data stream and employs the Viterbi algorithm, which exploits the properties of convolutional codes to ultimately determine the input bit stream U(D) 105.

One advantage of convolutional codes is their highly repetitive structure, which provides for a symmetrical code tree. Such symmetry reduces the number of states that need to be evaluated in locating the most probable path. Moreover, in decoding such a symmetrical code, only the most probable local path leading into each of the 256 possible encoder states is of interest. All other paths may be discarded from further consideration, because the most probable global path through a state must necessarily include the most probable local path through that state. (Note that in some applications of the Viterbi algorithm, the decision as to which local path is most probable may be deferred until information relating to subsequent states is available.)

The Viterbi decoder relies on these code properties to function as a finite state machine having a limited set of state transitions. The decoder hypothesizes each of the $2^{K-1}$ possible encoder states and determines the probability that the encoder transitioned from each of those states to each of the next set of $2^{K-1}$ possible encoder states. In this case, the transition probability is based on observations which are obtained from the received noisy convolutionally encoded data stream.

The probability of each state transition is expressed by a quantity, referred to as a metric, which represents a distance (e.g., in code space) between that state transition and what was actually observed at that point in the input data stream. This distance may be expressed as, for example, a Hamming distance, a Euclidean distance, or a negative logarithm of a probability value, depending on the particular application. Clearly, the smaller the metric, the higher the probability of occurrence. There are two types of metrics: state metrics and branch metrics. The state metric represents the relative probability that the transmitted set of code symbols passed through a particular state. The branch metric represents the conditional probability that the transition from a particular source state to a particular target state was transmitted (assuming that the source state was correct).

The Viterbi algorithm has been implemented efficiently by employing an Add-Compare-Select (ACS) unit 150, as illustrated in FIG. 1B. The ACS unit 150 calculates the target state metric values and also characterizes the relationships between the source and target states by virtue of ACS butterfly operations. FIG. 2 depicts a single ACS butterfly operation 155, which evaluates the only possible state transitions that could have occurred for two particular adjacent source states in encoder 100. This limitation is partly due to the fact that, at any given time, the state of encoder 100 is the encoder's previous state right-shifted by 1 bit. The next (right-shifted) information bit determines which transition is made from a source state and will appear as the most significant bit (MSB) of the target state. For a binary data stream, there are only two possible target states that a source state can transition to. Thus, as evidenced by FIG. 2, encoder 100 can only transition from source state "x0" to target state "0x" or "1x" and from source state "x1" to target state "0x" or "1x", depending on the value of the inputted data bit of bit stream U(D) 105. In this figure, and elsewhere, notations "x0" and "x1" indicate that the least significant bit (LSB) of the source state is "0" and "1", respectively, while the upper bits are represented by "x"; and notations "0x" and "1x" indicate that the MSB of the target states are "0" or "1", respectively, while the lower bits are represented by "x". The term "x" represents the same value (e.g., a 7-bit value) whether it is included in the number of a source state or of a target state.

FIG. 2 also reveals that each pair of transitions from the source states to the target states generates a hypothesized pair of code symbols $H_0(D)$, $H_1(D)$ or $\overline{H}_0(D)$, $\overline{H}_1(D)$. In fact, when the most likely transitions are along the parallel branches of the ACS butterfly 155 (e.g., transitions from "x0" to "0x" and from "x1" to "1x"), the pair $H_0(D)$, $H_1(D)$ is generated. This feature is due in part to the repetitive nature of convolutional codes in general, as well as to the use of generator code polynomials having their MSBs and LSBs set to unity (i.e., for both $G_0(D)$ and $G_1(D)$, factors $g_0$ and $g_7$ are equal to 1). In like fashion, code symbols $\overline{H}_0(D)$, $\overline{H}_1(D)$ are generated when the most likely transitions are along the diagonal branches of the ACS butterfly 155 (e.g., transitions from "x0" to "1x" and from "x1" to "0x").

As stated above, the ACS 150 unit calculates the target state metrics $tm_{0x}$, $tm_{1x}$. The ACS 150 logic receives the source state metrics $sm_{x0}$, $sm_{x1}$ which relate to the probability that a received set of n code symbols leads to source states "x0" and "x1", respectively. Returning to FIG. 1B, upon receiving a set of code symbols, the branch metric unit 140 computes the branch metric values $bm_{i,j}$, $bm_{\overline{i,j}}$. The branch metrics $bm_{i,j}$, $bm_{\overline{i,j}}$ represent the conditional probability that the transition from a particular source state to a particular target state occurred. Specifically, for a rate 1/n convolutional code, branch metric $bm_{i,j}$ indicates how closely the set of n received code symbols matches the set of hypothesized code symbols $H_0(D)$, $H_1(D)$, and branch metric $bm_{\overline{i,j}}$ indicates how closely the set of n received code symbols matches the hypothesized set $\overline{H}_0(D)$, $\overline{H}_1(D)$. ACS 150 "adds" the branch metric $bm_{i,j}$, $bm_{\overline{i,j}}$ corresponding to each of the two transitions leading to a particular target state to the corresponding source state metric $sm_{x0}$, $sm_{x1}$.

For each of the two target states, ACS 150 then "compares" the sums of the source state metric and branch metric pairs leading to that target state. The most likely transition into each target state, represented by the smallest metric sum, is then "selected" by ACS 150 and assigned to that target state as the target state metric $tm_{0x}$, $tm_{1x}$.

As stated above, the ACS 150 logic adds the branch metric $bm_{i,j}$, $bm_{\overline{i,j}}$ to the source state metric $sm_{x0}$, $sm_{x1}$ for each of the two transitions leading to a target state and decides that the most likely path into that target state came from the transition that yields the smaller metric sum. The smaller metric sum then becomes the new target state metric $tm_{0x}$, $tm_{1x}$. The ACS 150 also stores the target state metrics (i.e., the costs associated with the most likely path leading to each target state) into the state random-access memory (RAM) 145. As indicated by FIG. 1B, the selection of the smallest metric sum results in the storing of the LSB of the winning source state metric, referred to as a decision bit, in the path memory of a chainback memory unit 160.

To facilitate the description of the related art, we will define a process cycle as the number of clock cycles required to calculate new target state metrics for two complete (and consecutive) levels of (K−1) encoder states by performing ACS butterfly operations upon two consecutive sets of n received symbols. For example, a Viterbi decoder having a single ACS butterfly 155, as depicted in FIG. 2, would generally produce two target states per clock cycle and would thus require 128 clock cycles per received code symbol to perform the ACS operations for all 256 states of encoder 100 (i.e. one complete level) Therefore, a process cycle for such a decoder would be defined as 256 clock cycles. To improve processing speed, ACS butterfly array architectures that employ multiple ACS butterflies 155 may be used to reduce the number of clock cycles per process cycle.

One example of such an architecture is the 2×2 ACS butterfly array 300, depicted by FIG. 3, which operates on two consecutive received code symbols in order to improve processing speed. As described above, ACS butterfly 155 reads two source states (e.g., states x0and x1) and calculates two target states (e.g., states 0x and 1x). For encoder 100, having constraint length K=9, x represents a 7-bit place-holder (i.e., x=[$x_6$, $x_5$, $x_4$, $x_3$, $x_2$, $x_1$, $x_0$]) which is incremented from 0 through 127 over a period of 128 clock cycles. If x=0000000, for example, the 2×2 ACS butterfly array 300 reads a block of four source states=0000 0000, 0000 0001, 0000 0010, and 0000 0011 (i.e., 00(H), 01(H), 02(H), and 03(H), where the label (H) indicates a hexadecimal number) from memory (e.g., state RAM 145). The 2×2 ACS butterfly array 300 then calculates the correspond block of four target states=0000 0000, 1000 0000, 0100 0000, 1100 0000 (i.e., 00(H), 80(H), 40(H), and C0(H)) and writes them into memory. Because at least some of the target states in the output block (e.g., 00(H), 80(H), 01(H), 81(H)) may represent different encoder states than the source states in the input block (e.g., 00(H), 01(H), 02(H), 03(H)), the output block of target states is stored to a different memory location (e.g. within state RAM 145). In this manner, butterfly array 300 may complete one process cycle (for K=9) in 64 clock cycles.

Another example is the 4×2 ACS butterfly array 400, illustrated in FIGS. 4A, 4B and proposed in U.S. patent application Ser. No. 09/422,920, filed Oct. 21, 1999, entitled "High-Speed ACS for Viterbi Decoder Implementations" assigned to the assignee of the present application and herein incorporated by reference. The 4×2 ACS butterfly array 400 boasts an 8× improvement in processing speed by virtue of implementing two sets of four ACS butterfly 155 units in parallel. During each clock cycle, the first stage of array 400 reads a block of eight source states and calculates the corresponding block of eight intermediate target state metrics for a set of n received code symbols. The parameter X, which is included as part of the source and target states in FIG. 4A, represents a four-bit place-holder (i.e., X=[$X_3$, $X_2$, $X_1$, $X_0$]) that is incremented from 0 to 15 over a period of sixteen clock cycles. The intermediate target states are rearranged to feed into the second stage of the array 400 (as source states) and the corresponding block of eight target state metrics are calculated for the subsequent set of n received code symbols. Thus, butterfly array 400 is capable of computing a complete set of target state metrics for two sets of n received code symbols (i.e., one process cycle) for K=9 in only 32 clock cycles.

Still another example architecture is the modified 8×1 ACS butterfly array 500, illustrated in FIGS. 5A, 5B and also described in U.S. patent application Ser. No. 09/422, 920 incorporated by reference above. Array 500 also proffers an 8× improvement in processing speed by virtue of implementing eight parallel ACS butterfly units 155 in parallel. For one set of n received code symbols, 8×1 butterfly array 500 uses all eight butterfly units 155 to read a block of 16 source states and calculate the corresponding block of 16 target state metrics (as identified by the 4-bit counter X) in one clock cycle. During the next clock cycle, butterfly array 500 uses the calculated target states as source states for the subsequent set of n received code symbols. Thus, for two received code symbols, 8×1 butterfly array 500 computes the target state metrics for all 256 possible states of encoder 100 (i.e., one process cycle) in 32 clock cycles.

Generally, ACS architectures such as those described above require the state RAM to be divided into two separate areas. The source states are read from one area, while the target states are written to the second area. When the source states have been consumed (e.g. after each process cycle), the roles of the memory areas are switched (i.e. the target states previously written are read and the source states previously read are overwritten). This double buffering operation continues until all 256 target states have been calculated. Although double buffering may be wasteful (of chip area, for example), the technique has been used because at least some of the target states generated in the output block may correspond to different encoder states than the source states which are consumed to produce them.

To obviate the need for double buffering, a technique has been proposed in U.S. patent application Ser. No. 09/129,021, filed on Aug. 4, 1998 and entitled "Single RAM Add-Compare-Select Unit for Serial Viterbi Decoder" assigned to the assignee of the present application and herein incorporated by reference. The proposed technique attempts to overcome double buffering by providing a novel addressing scheme for determining the address from which to read each source state. In this technique, a modulo-N ACS cycle counter is incremented every time a complete set of $2^{K-1}$ source states is processed (N being dependent on the particular architecture). In order to derive the memory read address for each source state, the addressing scheme rotates the number of the source state to be processed, where the number of bits to rotate is indicated by the value of the modulo-N ACS cycle counter and the number of each source state is in the range of 0 to $2^{K-1}$. For example, during the first ACS cycle, no rotation is performed. During the second ACS cycle, the read address for each source state is obtained by rotating the state number by 1. During the third ACS cycle, the state number is rotated by 2 to obtain the read address for each source state. In each subsequent ACS cycle, the counter is successively incremented by 1 until the ACS cycle count reaches N−1, at which point the pattern repeats.

For parallelized ACS butterfly structures, it is desirable to maximize the number of states that are read out of (and written into) memory at one time. Moreover, to optimize memory utilization it is also desirable to write the calculated target states into the same memory locations that correspond to the consumed source states (i.e., the read addresses). However, to do so efficiently has required delaying the write operation for a number of clock cycles until a convenient number of contiguous target states are calculated. Thus, the calculated target states are temporarily stored in pipeline registers until a contiguous number of target states are calculated, at which time the contiguous target states are written into memory locations that have sequential addresses. It is to be noted that although such implementations may avoid double buffering, the number of pipeline registers they require increases as the number of target states calculated increases. Increasing pipeline registers increases circuit complexity, increases circuit area, and makes inefficient use of power. The number of pipeline registers needed is further aggravated by ACS butterfly architectures that employ parallel ACS butterflies 155 (such as the 2×2 and 4×2 configurations described above) to improve performance.

What is needed, therefore, is a method and apparatus capable of locating and storing states within a single memory in a manner that enhances the performance of high-rate ACS butterfly operations.

SUMMARY OF THE INVENTION

Methods and apparatuses consistent with the principles of the present invention address the need identified above by providing a method and apparatus that are capable of locating and storing states within a single memory in a manner that enhances the performance of high-rate ACS butterfly operations.

As such, in an exemplary embodiment, the present invention includes the application of an addressing scheme to determine the address locations of source state metrics during a process cycle. The source state metrics are read from those address so locations during the process cycle and applied to an add-compare-select butterfly operation of a Viterbi algorithm implementation to generate target state metrics. The method then stores the target state metrics into the address location or locations previously occupied by the source state metrics which were read. The method further provides an addressing scheme that determines the address locations of the source state metrics based on a process cycle counter that is incremented and rotated in accordance with the process cycle. The method also provides an addressing scheme that employs a predetermined function to determine the address locations of the source state metrics.

BRIEF DESCRIPTION OF THE DRAWINGS

The accompanying drawings, which are incorporated in and constitute a part of this Specification, illustrate an embodiment of the invention and, together with the description, explain the objects, advantages, and principles of the invention. In the drawings:

FIG. 9A is a diagram of a source state number.

FIG. 9B is a diagram of the location of the source state of FIG. 9A in a state RAM of a method or apparatus according to an embodiment of the invention.

FIG. 10A is a diagram of a source state number.

FIG. 10B is a diagram of the location of the source state of FIG. 10A in a state RAM of a method or apparatus according to an embodiment of the invention.

DETAILED DESCRIPTION OF THE PREFERRED EMBODIMENTS

The following detailed description of the present invention refers to the accompanying drawings that illustrate preferred embodiments consistent with this invention. Other embodiments are possible and modifications may be made to the embodiments without departing from the spirit and scope of the invention. Therefore, the following detailed description is not meant to limit the invention. Rather the scope of the invention is defined by the appended claims.

As described below, the present invention may be implemented in many different embodiments of software, firmware, and hardware in the entities illustrated in the figures. The actual software code or specialized control hardware used to implement the present invention is not limiting of the present invention. Thus, the operation and behavior of the present invention will be described without specific reference to the actual software code or specialized hardware components, as the description herein is provided to enable a person of ordinary skill in the art to design software and control hardware to implement the preferred embodiment of the present invention.

Figure 6:
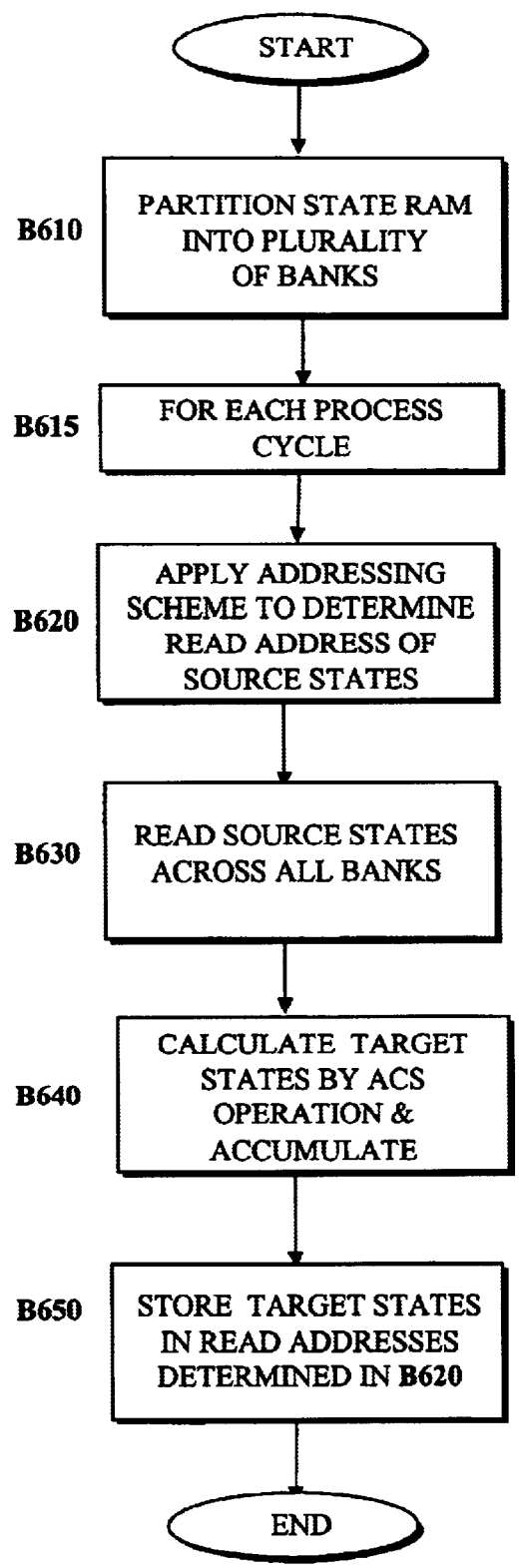
FIG. 6 is a high-level flow diagram depicting an embodiment of the present invention.

FIG. 6 is a high-level flow diagram depicting a process constructed and operative in accordance with an embodiment of the present invention. Such a process may be stored in any storage device, such as, for example, a computer system (non-volatile) memory, an optical disk, magnetic tape, or magnetic disk. Furthermore, such a process may be programmed when the computer system is manufactured or via a computer-readable medium at a later date. Such a medium may include any of the forms listed above with respect to storage devices and may further include, for example, a carrier wave modulated, or otherwise manipulated, to convey machine-readable code comprising instructions that can be read, demodulated/decoded and/or executed by one or more computers, microprocessors, digital signal processors, or other arrays of logic elements.

A state RAM as used to support the process of FIG. 6 is partitioned into a plurality of banks, each bank comprising a plurality of memory locations and each memory location accommodating a plurality of states. The number of banks used depends on the desired architecture, speed, and number of pipeline registers. Moreover, the greater the number of states that are stored in each memory location, the greater the number of pipeline registers that may be required. By partitioning the memory into a plurality of banks, the number of required pipeline registers may be reduced, resulting in fewer pipeline register delays. Such a configuration allows the target states to be written more quickly, with fewer registers, at the expense of more complicated address generation logic.

Figure 1A:
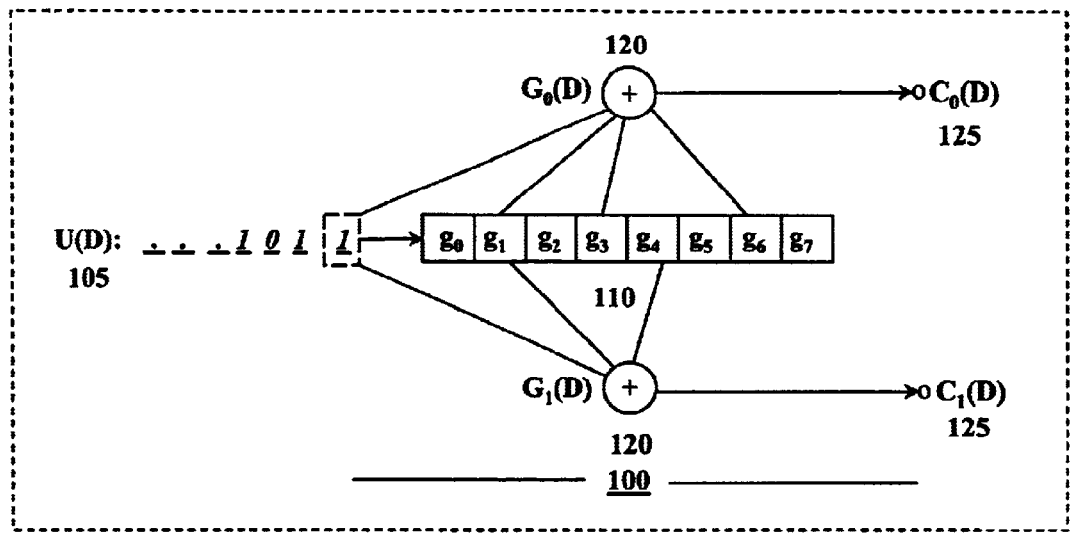
FIG. 1A is a block level diagram illustrating a K=9, rate=½ convolutional encoder.
Figure 1B:
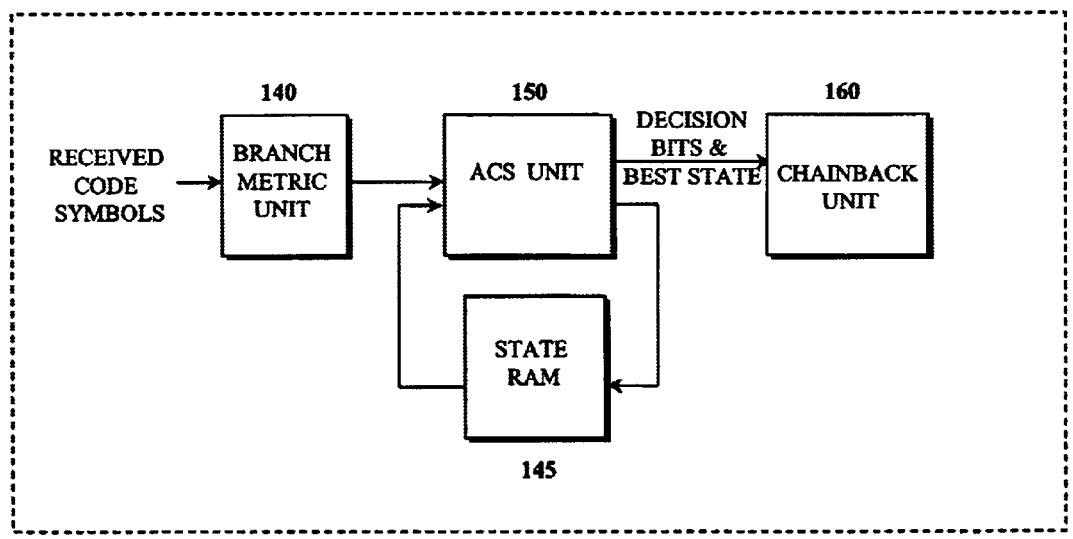
FIG. 1B is a system level block diagram depicting an ACS and chainback unit.
Figure 2A:
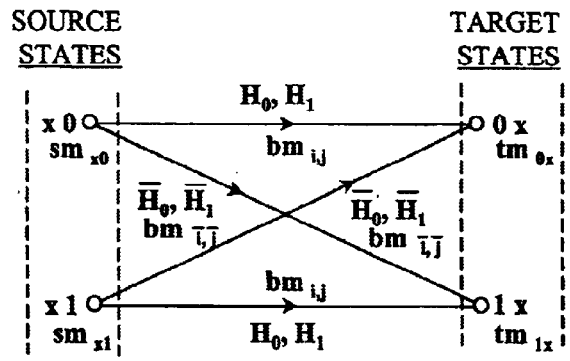
FIG. 2 is a transition diagram illustrating the basic ACS butterfly operation.
Figure 2B:
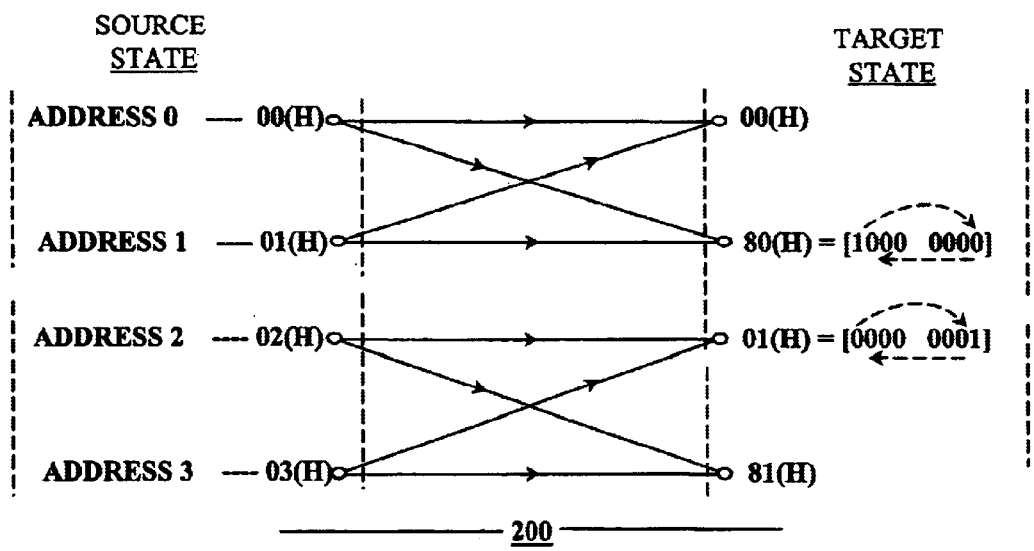
Figure 3:
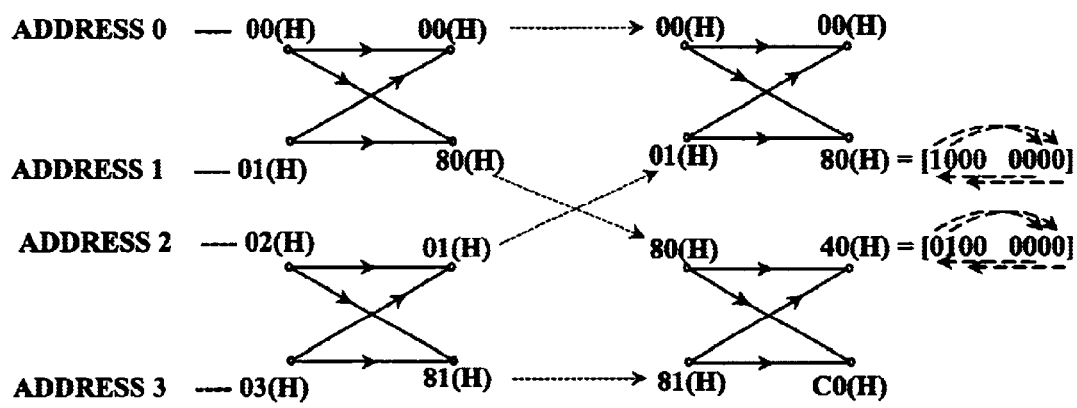
FIG. 3 is a transition diagram depicting a 2×2 ACS butterfly array.
Figure 4A:
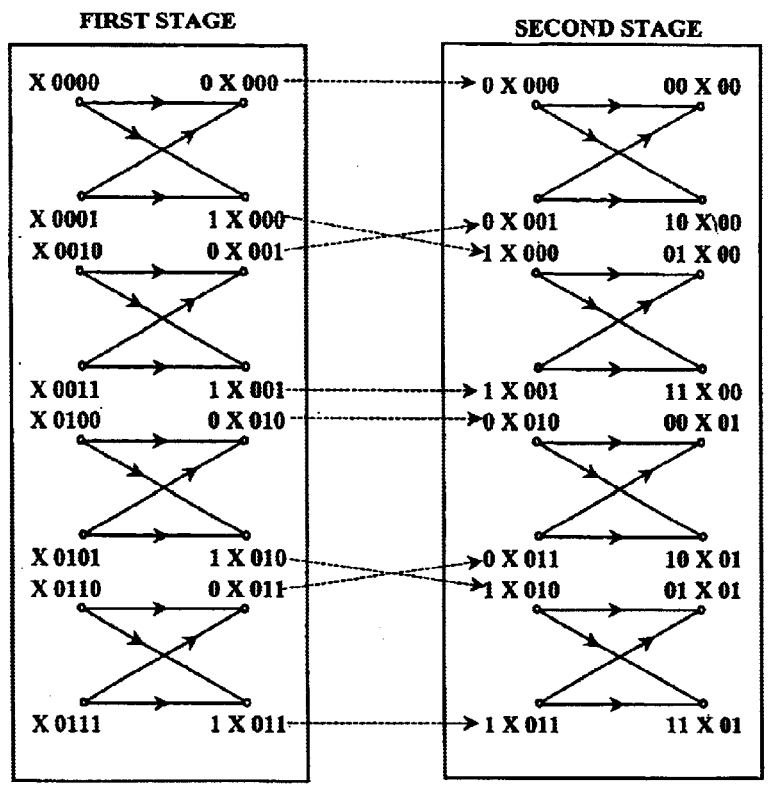
FIGS. 4A, 4B are transition diagrams depicting a 4×2 ACS butterfly array.
Figure 4B:
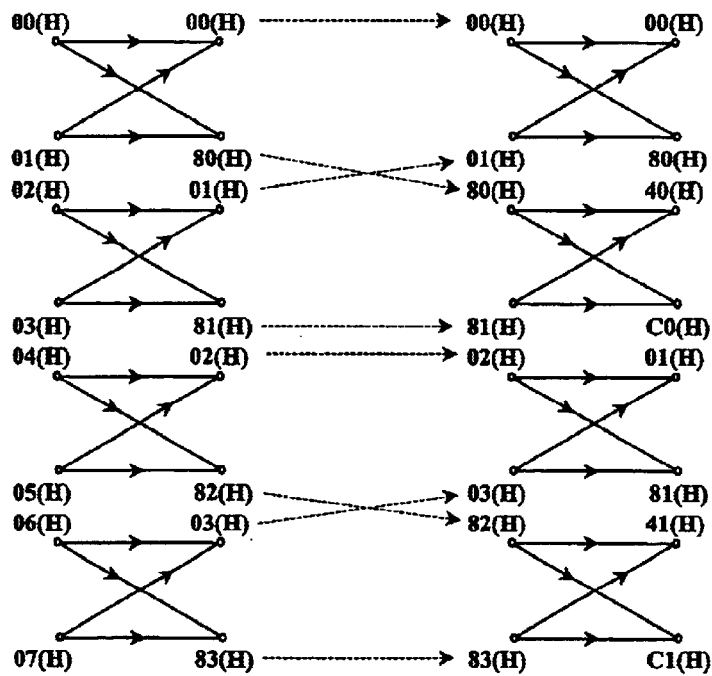
Figure 7:
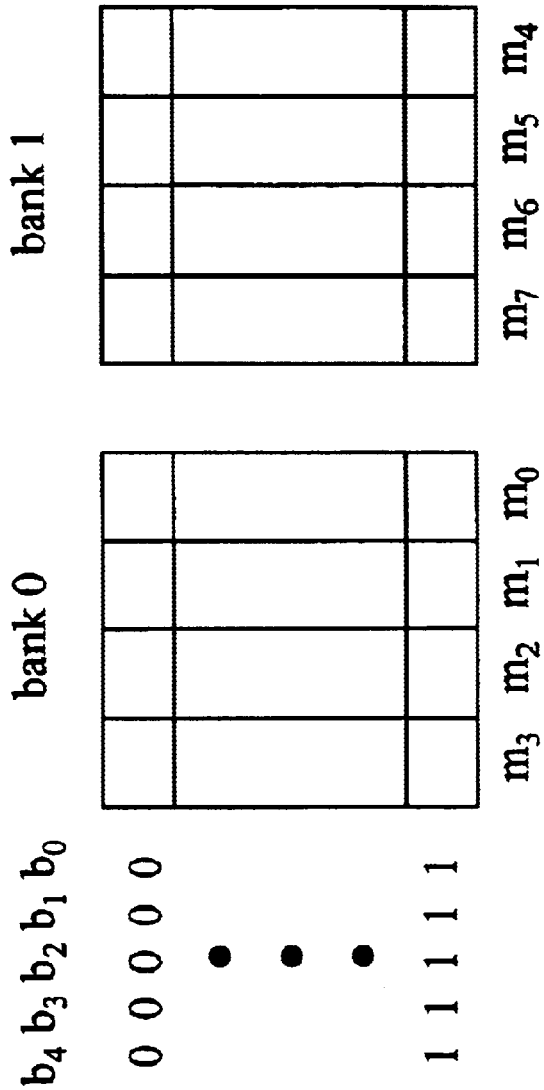
FIG. 7 is a diagram illustrating a configuration of the state RAM to support a method or apparatus according to an embodiment of the invention.

In one exemplary implementation, such as the aforementioned 4×2 ACS butterfly array 400, the state RAM is partitioned into two banks (e.g., bank 0 and bank 1), each bank having 32 portions, each portion storing four states (see FIG. 7). Each of the 32 portions in each bank is identified by a unique 6-bit address (e.g., $b_5, b_4, b_3, b_2, b_1, b_0$), with the LSB (i.e., $b_0$) serving as a bank select parameter and the upper 5 bits (i.e., $b_5, b_4, b_3, b_2, b_0$) specifying the address of the portion within the selected bank. In this particular example, the stored state labels $m_0$ to $m_7$ may correspond to the source state labels 00(H) to 07(H) in FIG. 4B, respectively, or another correspondence may be used. Each of the 32 portions in each bank stores 4 of the 256 possible states, for a total storage of 256 states for both banks.

Figure 5A:
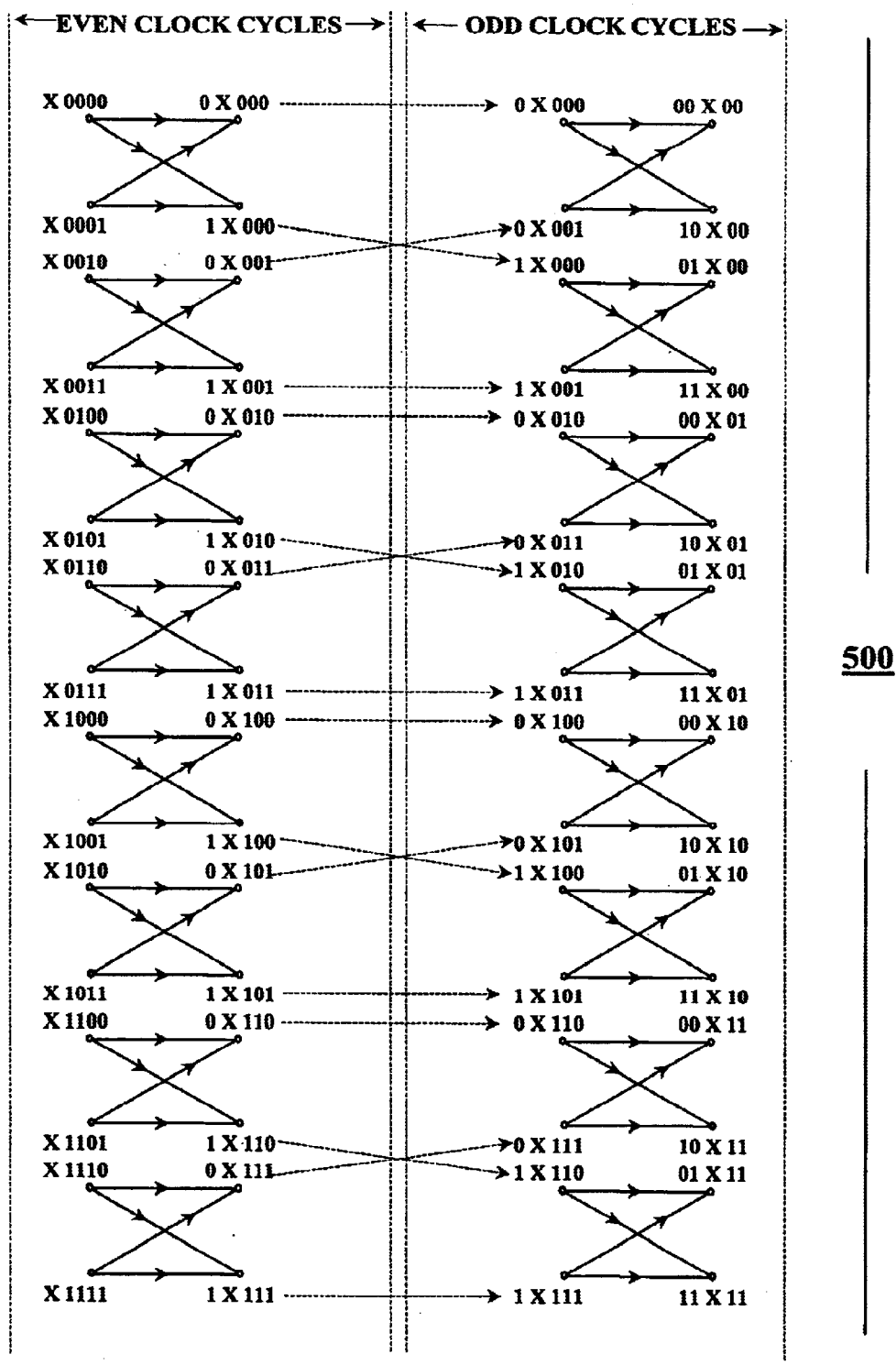
FIGS. 5A, 5B are transition diagrams depicting an 8×1 ACS butterfly array.
Figure 5B:
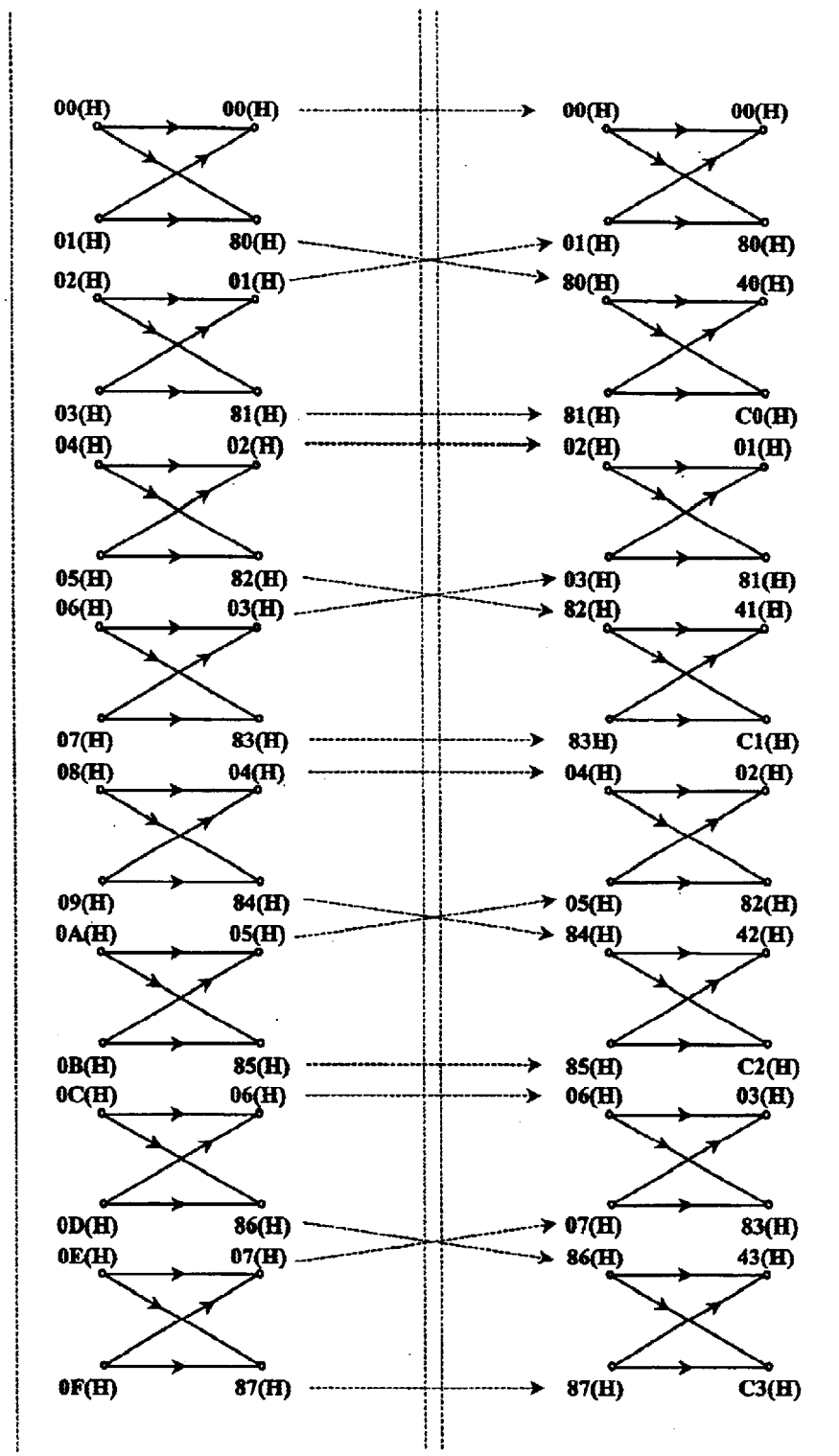
Figure 8:
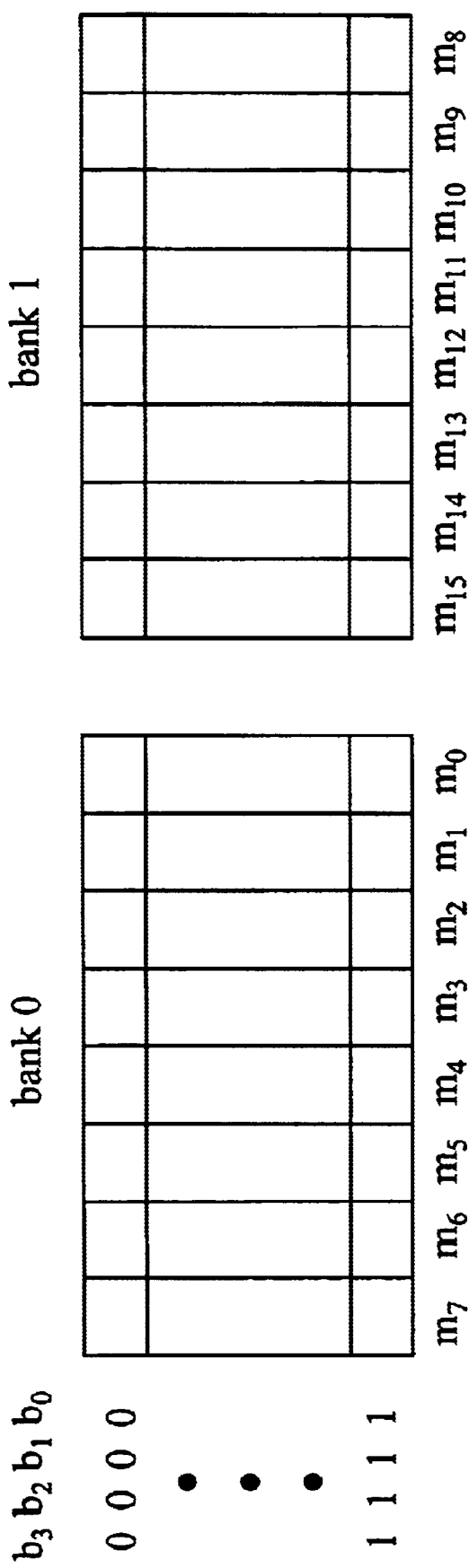
FIG. 8 is a diagram illustrating an configuration of state RAM to support a method or apparatus according to an embodiment of the invention.

In another exemplary implementation, such as the aforementioned 8×1 ACS butterfly array 500, the state RAM is also partitioned into two banks, with each bank having 16 portions, each portion storing eight states (see FIG. 8). Each of the 16 portions in each bank is identified by a unique 5-bit address (e.g., $b_4, b_3, b_2, b_1, b_0$), with the LSB (i.e., $b_0$) serving as a bank select parameter and the upper 4 bits (i.e., $b_4, b_3, b_2, b_1$) specifying the address of the portion within the selected bank. In this particular example, the stored state labels $m_0$ to $m_{15}$ may correspond to the source state labels 00(H) to 0F(H) in FIG. 5B, respectively, or another correspondence may be used. Each of the 16 portions in each bank stores 8 of the 256 possible states, for a total storage of 256 states for both banks.

As indicated in blocks B610, B615, and B660, the process is executed until a desired number of process cycles have been completed. As indicated in block B617, the tasks of blocks B620 to B650 are executed (e.g. in loop or pipeline fashion) for each block of source states in a process cycle.

In block B620, an addressing scheme is applied to determine the read address of each block of source states in the state RAM. As will be discussed below, buffering requirements are reduced by storing the target states calculated via the butterfly ACS operations back into the memory locations previously occupied by the consumed source states. This operation is allowable because once a source state stored in the state RAM has its value consumed, the state is not visited again for reading until the next process cycle.

Note, however, that in order to perform such a operation, it may not be desirable to read the source states from the state RAM according to the source state block number (defined as the number (in the range 0 to $2^{K-1}$) of one of the source states within the block modulo the number of states per block, and designated by the binary-valued labels $c_i$ to $c_1$, where i is the base-2 logarithm of the quantity [(number of source states)/(number of states per block)]). Moreover, it may not be desirable to read each portion of the source state block from the same relative location in each of the plurality of partitioned banks. As described below, the read addresses of the blocks of source states are determined in a manner that allows the corresponding generated target state blocks to be stored within the state RAM according to their block number (e.g. in sequential order). (In a different implementation of an embodiment of the invention, the write addresses of the blocks of target states may be determined instead in a manner that allows the source state blocks to be read according to their block number (e.g., in sequential order).)

In one exemplary implementation, the source state block read addresses are determined by rotating the block number according to the value of a modulo-N ACS cycle counter (where N is dependent on the particular architecture). The modulo-N ACS cycle counter is incremented each time a complete set of $2^{K-1}$ source states is processed. In this addressing scheme, the block number for each block of source states to be processed is rotated according to the ACS cycle count to derive the read address for that block. For parallelized ACS butterfly arrays 400 and 500, for example, the modulo-N counter is incremented by two for each process cycle.

In another exemplary implementation, the read address for each source state block portion is determined in part by applying a predetermined read function $f$ to the source state block portion number and the process cycle number:

$$\text{(source state block portion number, process cycle number)} \xrightarrow{f} \text{source state block read address}$$

The source state block portion number is designated by the binary-valued labels $c_i$ to $c_0$ and defined as the number (in the range 0 to $2^{K-1}$) of one of the source states within the block portion modulo the number of states per block portion. For a case in which the state RAM is partitioned into two banks, for example, the block portion number will be the block number with $c_0$ concatenated to the right-hand side. The read address for a particular source state block portion is defined by a combination of the source state block read address (i.e. as produced by function $f$) and the bank select parameter $c_0$, which indicates whether the portion is to be read from bank 0 or from bank 1.

Function $f$ depends upon the particular butterfly array configuration, and it uses the process cycle number, the source state block portion number (i.e. the source state block number and the label $c_0$), and rotation to calculate read addresses for source state block portions. Specifically, function $f$ generates the source state block portion read address by performing an exclusive-or (XOR) operation between a bank select parameter and certain bit values within the block number during specified process cycles and by rotating the block number to the left as the process cycle number progresses.

For the modified 8×1 ACS butterfly array 500, for example, one possible source state block portion read address function $f$ is presented in Table 1-A. As shown in Table 1-A, given a 5-bit block portion number $c_4$ to $c_0$ and a process cycle number, function $f$ determines a 4-bit block read address $b_3$ to $b_0$. Modified 8×1 ACS butterfly array 500 reads a total of 16 source states: one 8-state portion from each bank. As indicated in Table 1-A, for process cycle #0 the source states are read from location $b_3, b_2, b_1, b_0=c_4, c_3, c_2, c_1$ in each bank. For process cycle #1, the block number is twice rotated to the left so that the read address $b_3, b_2, b_1, b_0=c_2, c_1, (c_4 \text{ XOR } c_0), c_3$, where for one portion of the block $c_0=1$ and the portion is read from bank 1, and for the other portion $c_0=0$ and the portion is read from (a possibly different address in) bank 0. For cycle numbers with no modulo 4 remainder, therefore, the two block portions are read from the same location within each bank, while for cycle numbers that have a modulo 4 remainder, the two block portions are read from different locations within each bank. Note that in this implementation, the label $c_0$ serves as a bank select parameter.

Table 1-B depicts the pattern by which block portions are read during each process cycle based on this particular form of read function $f$ (the hexadecimal number in each cell corresponds to the first state of the portion addressed by the block portion number in the left column of the table, the block portion number being a concatenation of $b_3$ through $b_0$ with $c_0$). As can be seen from this table, the starting block portion address is revisited after 4 process cycles (i.e. N=4).

TABLE 1-A

| Process Cycle MOD 4 | SOURCE STATE BLOCK PORTION READ ADDRESS | | | |
|---|---|---|---|---|
| | $b_3$ | $b_2$ | $b_1$ | $b_0$ |
| 0 | $c_4$ | $c_3$ | $c_2$ | $c_1$ |
| 1 | $c_2$ | $c_1$ | $c_4$ XOR $c_0$ | $c_3$ |
| 2 | $c_4$ XOR $c_0$ | $c_3$ | $c_2$ XOR $c_0$ | $c_1$ |
| 3 | $c_2$ XOR $c_0$ | $c_1$ | $c_4$ | $c_3$ |

TABLE 1-B

| Block portion number | process cycle | | | | |
|---|---|---|---|---|---|
| | 0 | 1 | 2 | 3 | 4 |
| 00000 | 00 | 00 | 00 | 00 | 00 |
| 00001 | 08 | 80 | A0 | 28 | 08 |
| 00010 | 10 | 40 | 10 | 40 | 10 |
| 00011 | 18 | C0 | B0 | 68 | 18 |
| 00100 | 20 | 88 | 20 | 88 | 20 |
| 00101 | 28 | 08 | 80 | A0 | 28 |
| 00110 | 30 | C8 | 30 | C8 | 30 |
| 00111 | 38 | 48 | 90 | E0 | 38 |
| 01000 | 40 | 10 | 40 | 10 | 40 |
| 01001 | 48 | 90 | E0 | 38 | 48 |
| 01010 | 50 | 50 | 50 | 50 | 50 |
| 01011 | 58 | D0 | F0 | 78 | 58 |
| 01100 | 60 | 98 | 60 | 98 | 60 |
| 01101 | 68 | 18 | C0 | B0 | 68 |
| 01110 | 70 | D8 | 70 | D8 | 70 |
| 01111 | 78 | 58 | D0 | F0 | 78 |
| 10000 | 88 | 20 | 88 | 20 | 88 |
| 10001 | 80 | A0 | 28 | 08 | 80 |
| 10010 | 98 | 60 | 98 | 60 | 98 |
| 10011 | 90 | E0 | 38 | 48 | 90 |
| 10100 | A8 | A8 | A8 | A8 | A8 |
| 10101 | A0 | 28 | 08 | 80 | A0 |
| 10110 | B8 | E8 | B8 | E8 | B8 |
| 10111 | B0 | 68 | 18 | C0 | B0 |
| 11000 | C8 | 30 | C8 | 30 | C8 |
| 11001 | C0 | B0 | 68 | 18 | C0 |
| 11010 | D8 | 70 | D8 | 70 | D8 |
| 11011 | D0 | F0 | 78 | 58 | D0 |
| 11100 | E8 | B8 | E8 | B8 | E8 |
| 11101 | E0 | 38 | 48 | 90 | E0 |
| 11110 | F8 | F8 | F8 | F8 | F8 |
| 11111 | F0 | 78 | 58 | D0 | F0 |

By way of further explanation, FIGS. 9A and 9B show the relation as defined by the function $f$ (as shown in Table 1-A above) between a source state number (shown in FIG. 9-A) and the location of that source state (shown in FIG. 9B) in the state RAM (partitioned as shown in FIG. 8). In FIG. 9A, the binary-valued labels $c_4$ through $c_0$ indicate the block portion number, while the binary-valued labels $d_2$ through $d_0$ identify a particular one of the eight source states within designated block portion. After the function $f$ is applied to $c_4$ through $c_0$ as described above, the location of this state is shown in FIG. 9B, where the binary-value label $b_3$ through $b_0$ indicate the values outputted by function $f$ and the value $c_0$ serves as a bank select parameter.

One possible read function $f$ for the 4×2 ACS butterfly array is presented in Table 2-A. Given a 6-bit block portion number $c_5$ to $c_0$ and a process cycle number, this function $f$ determines a 5-bit block read address $b_4$ to $b_0$. As stated above, the 4×2 ACS butterfly array 400 reads a total of 8 source states: one 4-state portion from each bank. As indicated in Table 2-A, for process cycle #0 the source states are read from storage address $b_4, b_3, b_2, b_1, b_0=c_5, c_4, c_3, c_2, c_1$ in each bank. For process cycle #1, the block number is twice rotated to the left so that the read address $b_4$, $b_3$, $b_2$, $b_1$, $b_0$=$c_3$, $c_2$, $c_1$, ($c_4$ XOR $c_0$), $c_5$, where for one portion of the block $c_0$=1 and for the other portion $c_0$ =0 (again, the label $c_0$ serves as a bank select parameter.

In Table 2-B, the hexadecimal number in each cell corresponds to the first state of the portion addressed by the block portion number in the left column of the table, the block portion number being a concatenation of $b_4$ through $b_0$ with $c_0$. Because the number of bits in the block number is odd (i.e., 5), a greater number of iterations of rotating the addresses by two are required in order to revisit the initial address in this implementation. As can be seen from Table 2-B, therefore, the initial address is revisited after 12 process cycles (i.e. N=12) (although alternative implementations may only require 10 iterations).

TABLE 2-A

| Process Cycle MOD 12 | SOURCE STATE BLOCK PORTION READ ADDRESS | | | | |
|---|---|---|---|---|---|
| | $b_4$ | $b_3$ | $b_2$ | $b_1$ | $b_0$ |
| 0 | $c_5$ | $c_4$ | $c_3$ | $c_2$ | $c_1$ |
| 1 | $c_3$ | $c_2$ | $c_1$ | $c_4$ XOR $c_0$ | $c_5$ |
| 2 | $c_1$ | $c_4$ XOR $c_0$ | $c_5$ | $c_2$ XOR $c_0$ | $c_3$ |
| 3 | $c_5$ | $c_2$ XOR $c_0$ | $c_3$ | $c_4$ | $c_1$ |
| 4 | $c_3$ | $c_4$ | $c_1$ | $c_2$ | $c_5$ |
| 5 | $c_1$ | $c_2$ | $c_5$ | $c_4$ XOR $c_0$ | $c_3$ |
| 6 | $c_5$ | $c_4$ XOR $c_0$ | $c_3$ | $c_2$ XOR $c_0$ | $c_1$ |
| 7 | $c_3$ | $c_2$ XOR $c_0$ | $c_1$ | $c_4$ | $c_5$ |
| 8 | $c_1$ | $c_4$ | $c_5$ | $c_2$ | $c_3$ |
| 9 | $c_5$ | $c_2$ | $c_3$ | $c_4$ XOR $c_0$ | $c_1$ |
| 10 | $c_3$ | $c_4$ XOR $c_0$ | $c_1$ | $c_2$ XOR $c_0$ | $c_5$ |
| 11 | $c_1$ | $c_2$ XOR $c_0$ | $c_5$ | $c_4$ | $c_3$ |

TABLE 2-B

| Block portion number | process cycle | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| 000000 | 00 | 00 | 00 | 00 | 00 | 00 | 00 | 00 | 00 | 00 | 00 | 00 | 00 |
| 000001 | 04 | 40 | 50 | 14 | 04 | 40 | 50 | 14 | 04 | 40 | 50 | 14 | 04 |
| 000010 | 08 | 80 | 20 | 08 | 80 | 20 | 08 | 80 | 20 | 08 | 80 | 20 | 08 |
| 000011 | 0C | C0 | 70 | 1C | 84 | 60 | 58 | 94 | 24 | 48 | D0 | 34 | 0C |
| 000100 | 10 | 44 | 10 | 44 | 10 | 44 | 10 | 44 | 10 | 44 | 10 | 44 | 10 |
| 000101 | 14 | 04 | 40 | 50 | 14 | 04 | 40 | 50 | 14 | 04 | 40 | 50 | 14 |
| 000110 | 18 | C4 | 30 | 4C | 90 | 64 | 18 | C4 | 30 | 4C | 90 | 64 | 18 |
| 000111 | 1C | 84 | 60 | 58 | 94 | 24 | 48 | D0 | 34 | 0C | C0 | 70 | 1C |
| 001000 | 20 | 08 | 80 | 20 | 08 | 80 | 20 | 08 | 80 | 20 | 08 | 80 | 20 |
| 001001 | 24 | 48 | D0 | 34 | 0C | C0 | 70 | 1C | 84 | 60 | 58 | 94 | 24 |
| 001011 | 2C | C8 | F0 | 3C | 8C | E0 | 78 | 9C | A4 | 68 | D8 | B4 | 2C |
| 001100 | 30 | 4C | 90 | 64 | 18 | C4 | 30 | 4C | 90 | 64 | 18 | C4 | 30 |
| 001101 | 34 | 0C | C0 | 70 | 1C | 84 | 60 | 58 | 94 | 24 | 48 | D0 | 34 |
| 001110 | 38 | CC | B0 | 6C | 98 | E4 | 38 | CC | B0 | 6C | 98 | E4 | 38 |
| 001111 | 3C | 8C | E0 | 78 | 9C | A4 | 68 | D8 | B4 | 2C | C8 | F0 | 3C |
| 010000 | 44 | 10 | 44 | 10 | 44 | 10 | 44 | 10 | 44 | 10 | 44 | 10 | 44 |
| 010001 | 40 | 50 | 14 | 04 | 40 | 50 | 14 | 04 | 40 | 50 | 14 | 04 | 40 |
| 010010 | 4C | 90 | 64 | 18 | C4 | 30 | 4C | 90 | 64 | 18 | C4 | 30 | 4C |
| 010011 | D0 | 34 | 0C | C0 | 70 | 1C | 84 | 60 | 58 | 94 | 24 | 48 | 48 |
| 010100 | 54 | 54 | 54 | 54 | 54 | 54 | 54 | 54 | 54 | 54 | 54 | 54 | 54 |
| 010101 | 14 | 04 | 40 | 50 | 14 | 04 | 40 | 50 | 14 | 04 | 40 | 50 | 50 |
| 010110 | D4 | 74 | 5C | D4 | 74 | 5C | D4 | 74 | 5C | D4 | 74 | 5C | 5C |
| 010111 | 94 | 24 | 48 | D0 | 34 | 0C | C0 | 70 | 1C | 84 | 60 | 58 | 58 |
| 011000 | 18 | C4 | 30 | 4C | 90 | 64 | 18 | C4 | 30 | 4C | 90 | 64 | 64 |
| 011001 | 58 | 94 | 24 | 48 | D0 | 34 | 0C | C0 | 70 | 1C | 84 | 60 | 60 |
| 011010 | 98 | E4 | 38 | CC | B0 | 6C | 98 | E4 | 38 | CC | B0 | 6C | 6C |
| 011011 | D8 | B4 | 2C | C8 | F0 | 3C | 8C | E0 | 78 | 9C | A4 | 68 | 68 |
| 011100 | 5C | D4 | 74 | 5C | D4 | 74 | 5C | D4 | 74 | 5C | D4 | 74 | 74 |
| 011101 | 1C | 84 | 60 | 58 | 94 | 24 | 48 | D0 | 34 | 0C | C0 | 70 | 70 |
| 01110 | DC | F4 | 7C | DC | F4 | 7C | DC | F4 | 7C | DC | F4 | 7C | 7C |
| 011111 | 9C | A4 | 68 | D8 | B4 | 2C | C8 | F0 | 3C | 8C | E0 | 78 | 78 |
| 100000 | 80 | 20 | 08 | 80 | 20 | 08 | 80 | 20 | 08 | 80 | 20 | 08 | 80 |
| 100001 | 60 | 58 | 94 | 24 | 48 | D0 | 34 | 0C | C0 | 70 | 1C | 84 | 84 |
| 100010 | A0 | 28 | 88 | A0 | 28 | 88 | A0 | 28 | 88 | A0 | 28 | 88 | 88 |
| 100011 | E0 | 78 | 9C | M | 68 | D8 | B4 | 2C | C8 | F0 | 3C | 8C | 8C |
| 100100 | 64 | 18 | C4 | 30 | 4C | 90 | 64 | 18 | C4 | 30 | 4C | 90 | 90 |
| 100101 | 24 | 48 | D0 | 34 | 0C | C0 | 70 | 1C | 84 | 60 | 58 | 94 | 94 |
| 100110 | E4 | 38 | CC | B0 | 6C | 98 | E4 | 38 | CC | B0 | 6C | 98 | 98 |
| 100111 | 9C | A4 | 68 | D8 | B4 | 2C | C8 | F0 | 3C | 8C | E0 | 78 | 9C |
| 101000 | A0 | 28 | 88 | A0 | 28 | 88 | A0 | 28 | 88 | A0 | 28 | 88 | A0 |
| 101001 | A4 | 68 | D8 | B4 | 2C | C8 | F0 | 3C | 8C | E0 | 78 | 9C | A4 |
| 101010 | A8 | A8 | A8 | A8 | A8 | A8 | A8 | A8 | A8 | A8 | A8 | A8 | A8 |
| 101011 | AC | E8 | F8 | BC | AC | E8 | F8 | BC | AC | E8 | F8 | BC | AC |
| 101100 | B0 | 6C | 98 | E4 | 38 | CC | B0 | 6C | 98 | E4 | 38 | CC | B0 |
| 101101 | B4 | 2C | C8 | F0 | 3C | 8C | E0 | 78 | 9C | A4 | 68 | D8 | B4 |
| 101110 | B8 | EC | B8 | EC | B8 | EC | B8 | EC | B8 | EC | B8 | EC | B8 |
| 101111 | BC | AC | E8 | F8 | BC | AC | E8 | F8 | BC | AC | E8 | F8 | BC |
| 110000 | C4 | 30 | 4C | 90 | 64 | 18 | C4 | 30 | 4C | 90 | 64 | 18 | C4 |
| 110001 | C0 | 70 | 1C | 84 | 60 | 58 | 94 | 24 | 48 | D0 | 34 | 0C | C0 |
| 110010 | CC | B0 | 6C | 98 | E4 | 38 | CC | B0 | 6C | 98 | E4 | 38 | CC |
| 110011 | C8 | F0 | 3C | 8C | E0 | 78 | 9C | A4 | 68 | D8 | B4 | 2C | C8 |
| 110100 | D4 | 74 | 5C | D4 | 74 | 5C | D4 | 74 | 5C | D4 | 74 | 5C | D4 |
| 110101 | D0 | 34 | 0C | C0 | 70 | 1C | 84 | 60 | 58 | 94 | 24 | 48 | D0 |
| 110110 | DC | F4 | 7C | DC | F4 | 7C | DC | F4 | 7C | DC | F4 | 7C | DC |
| 110111 | D8 | B4 | 2C | C8 | F0 | 3C | 8C | E0 | 78 | 9C | A4 | 68 | D8 |
| 111000 | E4 | 38 | CC | B0 | 6C | 98 | E4 | 38 | CC | B0 | 6C | 98 | E4 |
| 111001 | E0 | 78 | 9C | A4 | 68 | D8 | B4 | 2C | C8 | F0 | 3C | 8C | E0 |
| 111010 | EC | B8 | EC | B8 | EC | B8 | EC | B8 | EC | B8 | EC | B8 | EC |
| 111011 | E8 | F8 | BC | AC | E8 | F8 | BC | AC | E8 | F8 | BC | AC | E8 |
| 111100 | F4 | 7C | DC | F4 | 7C | DC | F4 | 7C | DC | F4 | 7C | DC | F4 |
| 111101 | F0 | 3C | 8C | E0 | 78 | 9C | A4 | 68 | D8 | B4 | 2C | C8 | F0 |
| 111110 | FC | FC | FC | FC | FC | FC | FC | FC | FC | FC | FC | FC | FC |
| 111111 | F8 | BC | AC | E8 | F8 | BC | AC | E8 | F8 | BC | AC | E8 | F8 |

By way of further explanation, FIGS. 10A and 10B show the relation as defined by the function $f$ (as shown in Table 2-A above) between a source state number (shown in FIG. 10A) and the location of that source state (shown in FIG. 10B) in the state RAM (partitioned as shown in FIG. 7). In FIG. 10A, the binary-valued labels $c_5$ through $c_0$ indicate the block portion number, while the binary-valued labels $d_1$ through $d_0$ identify a particular one of the four source states within a designated block portion. After the function $f$ is applied to $c_5$ through $c_0$ as described above, the location of this state is shown in FIG. 10B, where the binary-valued labels $b_3$ through $b_0$ indicate the values outputted by function $f$ and the value $c_0$ serves as a bank select parameter.

Returning to the process of FIG. 6, the source states included in the address locations rendered by the addressing scheme (of block B620) are read in block B630. In block 640, the target states corresponding to the read source states are calculated in accordance with the ACS butterfly operation. As stated above, the 4×2 ACS butterfly array 400 calculates 8 target states for one received code symbol and then rearranges the intermediate target states and feeds them back, as source states, to calculate the 8 corresponding target states for the next received code symbol. During each clock cycle, the 4×2 ACS butterfly array 400 reads 8 source states and calculates a total of 8 target states. Thus, 4×2 ACS butterfly array 400 calculates all 256 states for two sets of n received code symbols (i.e., a total of 512 states) in 32 clock cycles or 1 process cycle.

In similar fashion, the 8×1 ACS butterfly array 500 calculates the 16 target states for one set of n received code symbols during one clock cycle and then uses the calculated target states as source states to calculate the 16 corresponding target states for the next set of n received code symbols during a subsequent clock cycle. During each clock cycle, the 8×1 ACS butterfly array 500 reads 16 source states and calculates 16 target states. Thus, the 8×1 ACS butterfly array 500 calculates all 256 states for one set of n received code symbols in 16 clock cycles and calculates all 256 states for both sets of n received code symbols in 32 clock cycles or 1 process cycle.

Finally, in block B650, the accumulated target states are stored to the read addresses determined in block B620. To efficiently utilize the state RAM, the contents of the read address memory locations are overwritten with the accumulated target state values. As stated above, because the banks are separately addressable, each portion of a target state block is written into the state RAM individually (although more than one portion may be written in parallel). For example, for the 4×2 ACS butterfly array 400, the target states are written in 4-state portions. Similarly, for the modified 8×1 ACS butterfly array 500, the target states are written in 8-state portions.

Figure 11:
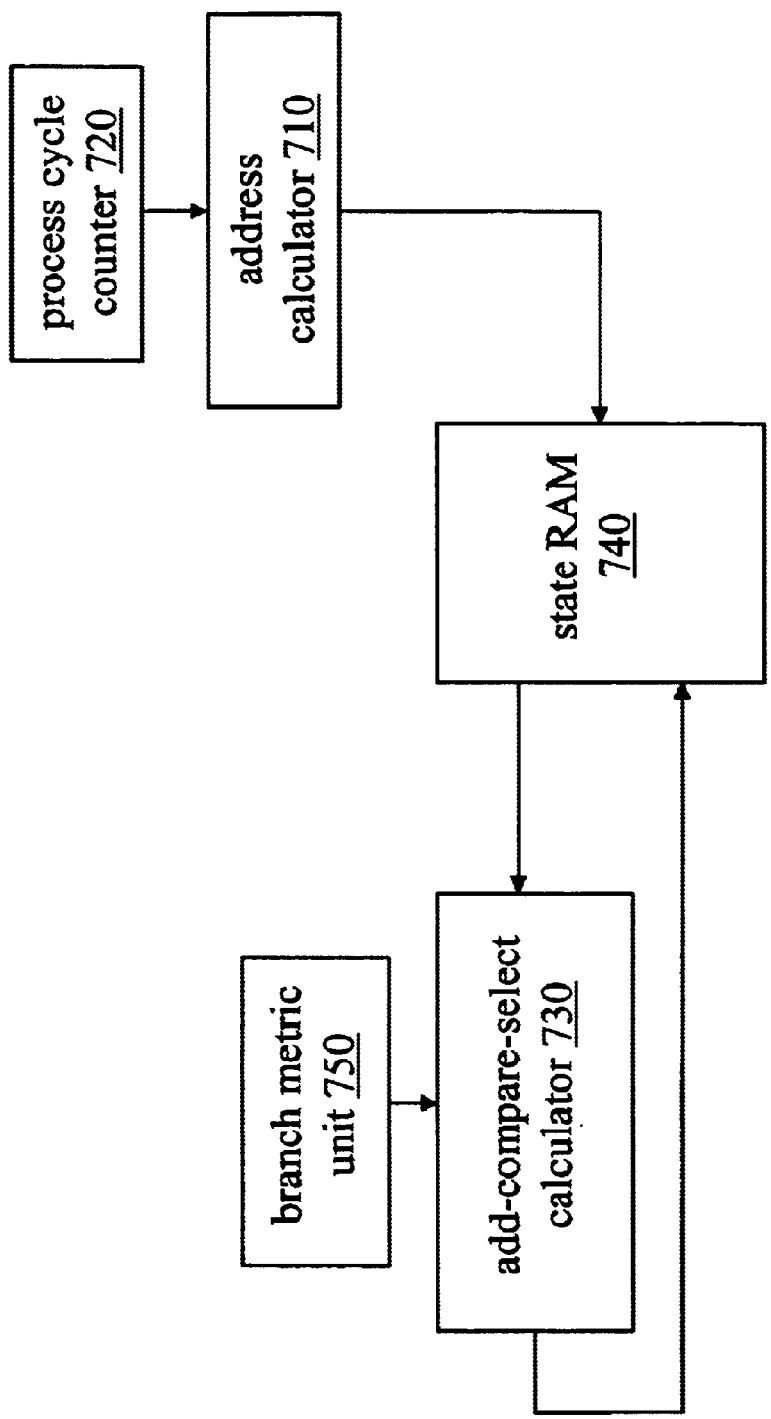
FIG. 11 is a block diagram of an apparatus according to an embodiment of the invention.

FIG. 11 shows an apparatus according to an embodiment of the invention. Process cycle counter 720 (which may be a modulo N counter) is incremented for each completed process cycle. Address calculator 710 is configured to receive the process cycle count and to determine address locations for each block portion as described above. State RAM 740 is configured to receive these address locations and output a block of source state metrics to ACS calculator 730. ACS calculator 730 is configured to calculate a block of target state metrics from the block of source state metrics and from data outputted by branch metric unit 750. State RAM 740 is also configured to receive the block of target state metrics from ACS calculator 730 and to store the block in the address locations from which the block of source state metrics was read, thereby overwriting the block of source state metrics. Note that one or more of address calculator 710, process cycle counter 720, ACS calculator 730, and branch metric unit 750 may comprise (in whole or in part) a set of instructions executing on the same microprocessor, digital signal processor, or similar array of logic elements as another of address calculator 710, process cycle counter 720, ACS calculator 730, and branch metric unit 750.

As such, the described embodiments provide a method and apparatus that are capable of locating and storing states within a single memory in a manner that strikes a balance between partitioned memory banks, pipeline registers, and circuit complexity to enhance the performance of high-rate ACS butterfly operations.

Moreover, the foregoing description of the preferred embodiments provides an illustration and description, but is not intended to be exhaustive or to limit the invention to the precise form disclosed. Modifications and variations are possible consistent with the above teachings or may be acquired from practice of the invention. For example, the architecture of the embodiments disclosed herein can easily be extended to operate on other array configurations such as, a 16×1 array or 32×1 array, where 32 or 64 states can be generated per clock cycle. Additionally, instead of operating on one or two sets of n received symbols in a clock cycle, the embodiments can be adapted to operate on a greater number of sets of n received symbols per clock cycle. Although the described embodiments relate to the decoding of convolutional codes, embodiments of the invention may also be used in other applications of the Viterbi algorithm. Thus, it is noted that the scope of the invention is defined by the claims and their equivalents.

What is claimed is:

1. A method comprising:
   determining a plurality of address locations, each address location corresponding to one among a plurality of block portions of a block of source state metrics;
   reading said block of source state metrics from said address locations;
   performing a plurality of add-compare-select operations to calculate a block of target state metrics, each among said block of target state metrics being derived at least in part from a corresponding one among said block of source state metrics; and
   storing said block of target state metrics into said address locations,
   wherein said storing includes overwriting said plurality of block portions;
   wherein each among said add-compare-select operations includes:
      adding a first branch metric to a first one among said block of source state metrics to obtain a first sum,
      adding a second branch metric to a second one among said block of source state metrics to obtain a second sum,
      comparing said first sum to said second sum, and
      selecting one among said first sum and a said second sum according to said comparing;
   wherein said plurality of address locations includes a first bank location and a second bank location,
   wherein said first bank location is within a first bank and said second bank location is within a second bank;
   wherein said reading includes reading a first one among said plurality of block portions from said first bank location and reading a second one among said plurality of block portions from said second bank location;
   wherein said plurality of add-compare-select operations is performed by an 8×1 add-compare-select butterfly structure, and
   wherein said block of source state metrics comprises 16 source state metrics.

2. A method comprising:
   determining a plurality of address locations, each address location corresponding to one among a plurality of block portions of a block of source state metrics;
   reading said block of source state metrics from said address locations;
   performing a plurality of add-compare-select operations to calculate a block of target state metrics, each among said block of target state metrics being derived at least in part from a corresponding one among said block of source state metrics; and
   storing said block of target state metrics into said address locations,
   wherein said storing includes overwriting said plurality of block portions;
   wherein each among said add-compare-select operations includes:
      adding a first branch metric to a first one among said block of source state metrics to obtain a first sum,
      adding a second branch metric to a second one among said block of source state metrics to obtain a second sum,
      comparing said first sum to said second sum, and
      selecting one among said first sum and a said second sum according to said comparing;
   wherein said plurality of address locations includes a first bank location and a second bank location,
   wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by an 8×1 add-compare-select butterfly structure, and wherein said block of source state metrics comprises 16 source state metrics;

wherein said determining includes referencing a process cycle counter.

3. A method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics;

storing said block of target state metrics into said address locations, wherein said storing includes overwriting said plurality of block portions;

wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by an 8×1 add-compare-select butterfly structure, and wherein said block of source state metrics comprises 16 source state metrics;

wherein said determining includes referencing a process cycle counter;

wherein said determining includes applying a predetermined function as follows:

| Process cycle MOD 4 | $b_3$ | $b_2$ | $b_1$ | $b_0$ |
|---|---|---|---|---|
| 0 | $c_4$ | $c_3$ | $c_2$ | $c_1$ |
| 1 | $c_2$ | $c_1$ | $c_4$ XOR $c_0$ | $c_3$ |
| 2 | $c_4$ XOR $c_0$ | $c_3$ | $c_2$ XOR $c_0$ | $c_1$ |
| 3 | $c_2$ XOR $c_0$ | $c_1$ | $c_4$ | $c_3$ |

-continued wherein for each among said plurality of block portions:

$c_4$ through $c_0$ designate a block portion number of said block portion, said block portion number being defined by a number of a source state, said source state corresponding to one among the source state metrics within said block portion, and $b_3$ through $b_0$ designate a block address location for said block portion, and the address location corresponding to said block portion is defined by the block address location in combination with $c_0$, wherein $c_0$ serves as a bank select parameter.

4. A method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics; and storing said block of target state metrics into said address locations, wherein said storing includes overwriting said plurality of block portions;

wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by a 4×2 add-compare-select butterfly structure, and wherein said block of source state metrics comprises 8 source state metrics.

5. A method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics; and storing said block of target state metrics into said address locations, wherein said storing includes overwriting said plurality of block portions;

wherein each among said add-compare-select operations includes:
  adding a first branch metric to a first one among said block of source state metrics to obtain a first sum,
  adding a second branch metric to a second one among said block of source state metrics to obtain a second sum,
  comparing said first sum to said second sum, and
  selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by a 4×2 add-compare-select butterfly structure, and wherein said block of source state metrics comprises 8 source state metrics;

wherein said determining includes referencing a process cycle counter.

6. A method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics;

storing said block of target state metrics into said address locations;

wherein said storing includes overwriting said plurality of block portions;

wherein each among said add-compare-select operations includes:
  adding a first branch metric to a first one among said block of source state metrics to obtain a first sum,
  adding a second branch metric to a second one among said block of source state metrics to obtain a second sum,
  comparing said first sum to said second sum, and
  selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by a 4×2 add-compare-select butterfly structure, and wherein said block of source state metrics comprises 8 source state metrics;

wherein said determining includes referencing a process cycle counter;

wherein said determining includes applying a predetermined function as follows:

| Process Cycle MOD 12 | $b_4$ | $b_3$ | $b_2$ | $b_1$ | $b_0$ |
|---|---|---|---|---|---|
| 0  | $c_5$ | $c_4$            | $c_3$ | $c_2$            | $c_1$ |
| 1  | $c_3$ | $c_2$            | $c_1$ | $c_4$ XOR $c_0$  | $c_5$ |
| 2  | $c_1$ | $c_4$ XOR $c_0$  | $c_5$ | $c_2$ XOR $c_0$  | $c_3$ |
| 3  | $c_5$ | $c_2$ XOR $c_0$  | $c_3$ | $c_4$            | $c_1$ |
| 4  | $c_3$ | $c_4$            | $c_1$ | $c_2$            | $c_5$ |
| 5  | $c_1$ | $c_2$            | $c_5$ | $c_4$ XOR $c_0$  | $C_3$ |
| 6  | $c_5$ | $c_4$ XOR $c_0$  | $c_3$ | $c_2$ XOR $c_0$  | $c_1$ |
| 7  | $c_3$ | $c_2$ XOR $c_0$  | $c_1$ | $c_4$            | $c_5$ |
| 8  | $c_1$ | $c_4$            | $c_5$ | $c_2$            | $c_3$ |
| 9  | $c_5$ | $c_2$            | $c_3$ | $c_4$ XOR $c_0$  | $c_1$ |
| 10 | $c_3$ | $c_4$ XOR $c_0$  | $c_1$ | $c_2$ XOR $c_0$  | $c_5$ |
| 11 | $c_1$ | $c_2$ XOR $c_0$  | $c_5$ | $c_4$            | $c_3$ | wherein for each among said plurality of block portions:

$c_5$ through $c_0$ designate a block portion number of said block portion, said block portion number being defined by a number of a source state, said source state corresponding to one among the source state metrics within said block portion, and $b_4$ through $b_0$ designate a block address location for said block portion, and the address location corresponding to said block portion is defined by the block address location in combination with $c_0$, wherein $c_0$ serves as a bank select parameter.

7. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM;

wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:
  adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises an 8×1 add-compare-select butterfly structure, and wherein said block of source state metrics comprises 16 source state metrics.

8. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM, wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises an 8×1 add-compare-select butterfly structure, and wherein said block of source state metrics comprises 16 source state metrics;

wherein said address calculator is configured to reference a process cycle counter.

9. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM, wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises an 8×1 add-compare-select butterfly structure, and wherein said block of source state metrics comprises 16 source state metrics;

wherein said address calculator is configured to reference a process cycle counter;

wherein said address calculator is configured to apply a predetermined function as follows:

| Process cycle MOD 4 | $b_3$ | $B_2$ | $b_1$ | $b_0$ |
|---|---|---|---|---|
| 0 | $c_4$ | $C_3$ | $c_2$ | $c_1$ |
| 1 | $c_2$ | $C_1$ | $c_4$ XOR $c_0$ | $c_3$ |
| 2 | $c_4$ XOR $c_0$ | $C_3$ | $c_2$ XOR $c_0$ | $c_1$ |
| 3 | $c_2$ XOR $c_0$ | $C_1$ | $c_4$ | $c_3$ | wherein for each among said plurality of block portions:

$c_4$ through $c_0$ designate a block portion number of said block portion, said block portion number being defined by a number of a source state, said source state corresponding to one among the source state metrics within said block portion, and $b_3$ through $b_0$ designate a block address location for said block portion, and the address location corresponding to said block portion is defined by the block address location in combination with $c_0$, wherein $c_0$ serves as a bank select parameter.

10. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM, wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises a 4×2 add-compare-select butterfly structure, and wherein said block of source state metrics comprises 8 source state metrics.

11. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM, wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises a 4×2 add-compare-select butterfly structure, and wherein said block of source state metrics comprises 8 source state metrics;

wherein said address calculator is configured to reference a process cycle counter.

12. An apparatus comprising:

a state random-access memory (RAM);

an address calculator to (A) determine a plurality of address locations within said state RAM, each address location corresponding to one among a plurality of block portions of a block of source state metrics, and to (B) provide the plurality of address locations to said state RAM;

an add-compare-select calculator to (C) receive said block of source state metrics from said state RAM, to (D) calculate a block of target state metrics, each among said block of target state metrics being derived at least in part from a corresponding one among said block of source state metrics, and to (E) provide said block of target state metrics to said state RAM, wherein said state RAM is configured to overwrite said plurality of block portions by storing said block of target state metrics into said address locations;

wherein said add-compare-select calculator is configured to perform a plurality of add-compare-select operations, and wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank of said state RAM and said second bank location is within a second bank of said state RAM;

wherein the address location corresponding to a first one among said plurality of block portions is said first bank location, and wherein the address location corresponding to a second one among said plurality of block portions is said second bank location;

wherein said add-compare-select calculator comprises a 4×2 add-compare-select butterfly structure, and wherein said block of source state metrics comprises 8 source state metrics;

wherein said address calculator is configured to reference a process cycle counter;

wherein said address calculator is configured to apply a predetermined function as follows:

| Process Cycle MOD 12 | $b_4$ | $b_3$ | $b_2$ | $b_1$ | $b_0$ |
|---|---|---|---|---|---|
| 0  | $c_5$ | $c_4$ | $c_3$ | $c_2$ | $c_1$ |
| 1  | $c_3$ | $c_2$ | $c_1$ | $c_4$ XOR $c_0$ | $c_5$ |
| 2  | $c_1$ | $c_4$ XOR $c_0$ | $c_5$ | $c_2$ XOR $c_0$ | $c_3$ |
| 3  | $c_5$ | $c_2$ XOR $c_0$ | $c_3$ | $c_4$ | $c_1$ |
| 4  | $c_3$ | $c_4$ | $c_1$ | $c_2$ | $c_5$ |
| 5  | $c_1$ | $c_2$ | $c_5$ | $c_4$ XOR $c_0$ | $C_3$ |
| 6  | $c_5$ | $c_4$ XOR $c_0$ | $c_3$ | $c_2$ XOR $c_0$ | $c_1$ |
| 7  | $c_3$ | $c_2$ XOR $c_0$ | $c_1$ | $c_4$ | $c_5$ |
| 8  | $c_1$ | $c_4$ | $c_5$ | $c_2$ | $c_3$ |
| 9  | $c_5$ | $c_2$ | $c_3$ | $c_4$ XOR $c_0$ | $c_1$ |
| 10 | $c_3$ | $c_4$ XOR $c_0$ | $c_1$ | $c_2$ XOR $c_0$ | $c_5$ |
| 11 | $c_1$ | $c_2$ XOR $c_0$ | $c_5$ | $c_4$ | $c_3$ | wherein for each among said plurality of block portions:

$c_5$ through $c_0$ designate a block portion number of said block portion, said block portion number being defined by a number of a source state, said source state corresponding to one among the source state metrics within said block portion, and $b_4$ through $b_0$ designate a block address location for said block portion, and the address location corresponding to said block portion is defined by the block address location in combination with $c_0$, wherein $c_0$ serves as a bank select parameter.

13. A data storage medium having machine-readable code stored thereon, the machine-readable code comprising instructions executable by an array of logic elements, the instructions defining a method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics; and storing said block of target state metrics into said address locations, wherein said storing includes overwriting said plurality of block portions;

wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by an 8×1 add-compare-select butterfly structure, and wherein said block of source state metrics comprises 16 source state metrics.

14. A data storage medium having machine-readable code stored thereon, the machine-readable code comprising instructions executable by an array of logic elements, the instructions defining a method comprising:

determining a plurality of address locations, each address location corresponding to one among a plurality of block portions of a block of source state metrics;

reading said block of source state metrics from said address locations;

performing a plurality of add-compare-select operations to calculate a block of target state metrics, each among said block of target state metrics being derived at least in part from a corresponding one among said block of source state metrics; and storing said block of target state metrics into said address locations, wherein said storing includes overwriting said plurality of block portions;

wherein each among said add-compare-select operations includes:

adding a first branch metric to a first one among said block of source state metrics to obtain a first sum, adding a second branch metric to a second one among said block of source state metrics to obtain a second sum, comparing said first sum to said second sum, and selecting one among said first sum and a said second sum according to said comparing;

wherein said plurality of address locations includes a first bank location and a second bank location, wherein said first bank location is within a first bank and said second bank location is within a second bank;

wherein said reading includes reading a first one among said plurality of block portions from said first bank location and reading a second one among said plurality of block portions from said second bank location;

wherein said plurality of add-compare-select operations is performed by an 8×1 add-compare-select butterfly structure, and wherein said block of source state metrics comprises 16 source state metrics;

wherein said determining includes referencing a process cycle counter.

15. A data storage medium having machine-readable code stored thereon, the machine-readable code comprising instructions executable by an array of logic elements, the instructions defining a method comprising:
  determining a plurality of address locations, each address location corresponding to one among a plurality of block portions of a block of source state metrics;
  reading said block of source state metrics from said address locations;
  performing a plurality of add-compare-select operations to calculate a block of target state metrics, each among said block of target state metrics being derived at least in part from a corresponding one among said block of source state metrics;
  storing said block of target state metrics into said address locations,
  wherein said storing includes overwriting said plurality of block portions;
  wherein each among said add-compare-select operations includes:
    adding a first branch metric to a first one among said block of source
    state metrics to obtain a first sum,
    adding a second branch metric to a second one among said block of source state metrics to obtain a second sum,
    comparing said first sum to said second sum, and
    selecting one among said first sum and a said second sum according to said comparing;
  wherein said plurality of address locations includes a first bank location and a second bank location, wherein said first bank location is within a first bank and said second bank location is within a second bank;
  wherein said reading includes reading a first one among said plurality of block portions from said first bank location and reading a second one among said plurality of block portions from said second bank location;
  wherein said plurality of add-compare-select operations is performed by an 8×1 add-compare-select butterfly structure, and wherein said block of source state metrics comprises 16 source state metrics;
  wherein said determining includes referencing a process cycle counter;
  wherein said determining includes applying a predetermined function as follows:

| Process cycle MOD 4 | $b_3$ | $b_2$ | $b_1$ | $b_0$ |
|---|---|---|---|---|
| 0 | $c_4$ | $c_3$ | $c_2$ | $c_1$ |
| 1 | $c_2$ | $c_1$ | $c_4$ XOR $c_0$ | $c_3$ |
| 2 | $c_4$ XOR $c_0$ | $c_3$ | $c_2$ XOR $c_0$ | $c_1$ |
| 3 | $c_2$ XOR $c_0$ | $c_1$ | $c_4$ | $c_3$ | wherein for each among said plurality of block portions:
    $c_4$ through $c_0$ designate a block portion number of said block portion, said block portion number being defined by a number of a source state, said source state corresponding to one among the source state metrics within said block portion, and
    $b_3$ through $b_0$ designate a block address location for said block portion, and
    the address location corresponding to said block portion is defined by the block address location in combination with $c_0$, wherein $c_0$ serves as a bank select parameter.

16. A data storage medium having machine-readable code stored thereon, the machine-readable code comprising instructions executable by an array of logic elements, the instructions defining a method comprising:
  determining a plurality of address locations, each address location corresponding to one among a plurality of block portions of a block of source state metrics;
  reading said block of source state metrics from said address locations;
  performing a plurality of add-compare-select operations to calculate a block of target state metrics, each among said block of target state metrics being derived at least in part from a corresponding one among said block of source state metrics; and
  storing said block of target state metrics into said address locations,
  wherein said storing includes overwriting said plurality of block portions;
  wherein each among said add-compare-select operations includes:
    adding a first branch metric to a first one among said block of source state metrics to obtain a first sum,
    adding a second branch metric to a second one among said block of source state metrics to obtain a second sum,
    comparing said first sum to said second sum, and
    selecting one among said first sum and a said second sum according to said comparing;
  wherein said plurality of address locations includes a first bank location and a second bank location,
  wherein said first bank location is within a first bank and said second bank location is within a second bank;
  wherein said reading includes reading a first one among said plurality of block portions from said first bank location and reading a second one among said plurality of block portions from said second bank location;
  wherein said plurality of add-compare-select operations is performed by a 4×2 add-compare-select butterfly structure, and
  wherein said block of source state metrics comprises 8 source state metrics.

17. A data storage medium having machine-readable code stored thereon, the machine-readable code comprising instructions executable by an array of logic elements, the instructions defining a method comprising:
  determining a plurality of address locations, each address location corresponding to one among a plurality of block portions of a block of source state metrics;
  reading said block of source state metrics from said address locations;
  performing a plurality of add-compare-select operations to calculate a block of target state metrics, each among said block of target state metrics being derived at least in part from a corresponding one among said block of source state metrics; and
  storing said block of target state metrics into said address locations,
  wherein said storing includes overwriting said plurality of block portions;

wherein each among said add-compare-select operations includes:
  adding a first branch metric to a first one among said block of source state metrics to obtain a first sum,
  adding a second branch metric to a second one among said block of source state metrics to obtain a second sum,
  comparing said first sum to said second sum, and
  selecting one among said first sum and a said second sum according to said comparing;
wherein said plurality of address locations includes a first bank location and a second bank location,
wherein said first bank location is within a first bank and said second bank location is within a second bank;
wherein said reading includes reading a first one among said plurality of block portions from said first bank location and reading a second one among said plurality of block portions from said second bank location;
wherein said plurality of add-compare-select operations is performed by a 4×2 add-compare-select butterfly structure, and wherein said block of source state metrics comprises 8 source state metrics;
wherein said determining includes referencing a process cycle counter;

18. A data storage medium having machine-readable code stored thereon, the machine-readable code comprising instructions executable by an array of logic elements, the instructions defining a method comprising:
  determining a plurality of address locations, each address location corresponding to one among a plurality of block portions of a block of source state metrics;
  reading said block of source state metrics from said address locations;
  performing a plurality of add-compare-select operations to calculate a block of target state metrics, each among said block of target state metrics being derived at least in part from a corresponding one among said block of source state metrics;
  storing said block of target state metrics into said address locations,
  wherein said storing includes overwriting said plurality of block portions;
  wherein each among said add-compare-select operations includes:
    adding a first branch metric to a first one among said block of source state metrics to obtain a first sum,
    adding a second branch metric to a second one among said block of source state metrics to obtain a second sum,
    comparing said first sum to said second sum, and
    selecting one among said first sum and a said second sum according to said comparing;
  wherein said plurality of address locations includes a first bank location and a second bank location, wherein said first bank location is within a first bank and said second bank location is within a second bank;
  wherein said reading includes reading a first one among said plurality of block portions from said first bank location and reading a second one among said plurality of block portions from said second bank location;
  wherein said plurality of add-compare-select operations is performed by a 4×2 add-compare-select butterfly structure, and wherein said block of source state metrics comprises 8 source state metrics;
  wherein said determining includes referencing a process cycle counter;
  wherein said determining includes applying a predetermined function as follows:

| Process Cycle MOD 12 | $b_4$ | $b_3$ | $b_2$ | $b_1$ | $b_0$ |
|---|---|---|---|---|---|
| 0 | $c_5$ | $c_4$ | $c_3$ | $c_2$ | $c_1$ |
| 1 | $c_3$ | $c_2$ | $c_1$ | $c_4$ XOR $c_0$ | $c_5$ |
| 2 | $c_1$ | $c_4$ XOR $c_0$ | $c_5$ | $c_2$ XOR $c_0$ | $c_3$ |
| 3 | $c_5$ | $c_2$ XOR $c_0$ | $c_3$ | $c_4$ | $c_1$ |
| 4 | $c_3$ | $c_4$ | $c_1$ | $c_2$ | $c_5$ |
| 5 | $c_1$ | $c_2$ | $c_5$ | $c_4$ XOR $c_0$ | $C_3$ |
| 6 | $c_5$ | $c_4$ XOR $c_0$ | $c_3$ | $c_2$ XOR $c_0$ | $c_1$ |
| 7 | $c_3$ | $c_2$ XOR $c_0$ | $c_1$ | $c_4$ | $c_5$ |
| 8 | $c_1$ | $c_4$ | $c_5$ | $c_2$ | $c_3$ |
| 9 | $c_5$ | $c_2$ | $c_3$ | $c_4$ XOR $c_0$ | $c_1$ |
| 10 | $c_3$ | $c_4$ XOR $c_0$ | $c_1$ | $c_2$ XOR $c_0$ | $c_5$ |
| 11 | $c_1$ | $c_2$ XOR $c_0$ | $c_5$ | $c_4$ | $c_3$ | wherein for each among said plurality of block portions:
  $c_5$ through $c_0$ designate a block portion number of said block portion, said block portion number being defined by a number of a source state, said source state corresponding to one among the source state metrics within said block portion, and
  $b_4$ through $b_0$ designate a block address location for said block portion, and
  the address location corresponding to said block portion is defined by the block address location in combination with $c_0$, wherein $c_0$ serves as a bank select parameter.

* * * * *